US009780066B2

(12) United States Patent
Wasserman

(10) Patent No.: US 9,780,066 B2
(45) Date of Patent: Oct. 3, 2017

(54) THERMOCOMPRESSION BONDING SYSTEMS AND METHODS OF OPERATING THE SAME

(71) Applicant: Kulicke and Soffa Industries, Inc., Fort Washington, PA (US)

(72) Inventor: Matthew B. Wasserman, Philadelphia, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 15/491,497

(22) Filed: Apr. 19, 2017

(65) Prior Publication Data

US 2017/0221854 A1    Aug. 3, 2017

Related U.S. Application Data

(62) Division of application No. 14/627,210, filed on Feb. 20, 2015, now Pat. No. 9,659,902.

(Continued)

(51) Int. Cl.
*H01L 21/00* (2006.01)
*H05K 3/00* (2006.01)
(Continued)

(52) U.S. Cl.
CPC .......... *H01L 24/81* (2013.01); *B32B 37/0046* (2013.01); *B32B 37/06* (2013.01); *H01L 21/67092* (2013.01); *H01L 21/67109* (2013.01); *H01L 21/67144* (2013.01); *H01L 21/67248* (2013.01); *H01L 24/75* (2013.01); *H05K 3/3494* (2013.01); *B32B 2457/14* (2013.01); *H01L 24/13* (2013.01); *H01L 24/16* (2013.01); *H01L 2224/13147* (2013.01); *H01L 2224/16227* (2013.01); *H01L 2224/759* (2013.01); *H01L 2224/7531* (2013.01); *H01L 2224/75252* (2013.01); *H01L 2224/75502* (2013.01);
(Continued)

(58) Field of Classification Search
CPC ......... H01L 24/00; H01L 24/81; H01L 21/00; H01L 21/60; H01L 21/67; H01L 21/67092; H01L 21/67109; H01L 21/67248; H01L 24/70; H01L 24/80; H01L 24/75; H05K 3/00; H05K 3/34; H05K 3/3494
See application file for complete search history.

(56) References Cited

U.S. PATENT DOCUMENTS 6,113,732 A * 9/2000 Yoshida .............. C23C 16/4412
                                                  118/723 R
2013/0333726 A1* 12/2013 Goshi ....................... B08B 3/10
                                                    134/18

* cited by examiner

*Primary Examiner* — Jacob T Minskey
*Assistant Examiner* — Matthew Hoover
(74) *Attorney, Agent, or Firm* — Stradley Ronon Stevens & Young, LLP

(57) ABSTRACT

A thermocompression bonding system for bonding semiconductor elements is provided. The thermocompression bonding system includes (1) a bond head assembly including a heater for heating an semiconductor element to be bonded, the bond head assembly including a fluid path configured to receive a cooling fluid; (2) a pressurized cooling fluid source; (3) a booster pump for receiving a pressurized cooling fluid from the pressurized cooling fluid source, and for increasing a pressure of the received pressurized cooling fluid; (4) a pressurized fluid reservoir for receiving pressurized cooling fluid from the booster pump; and (5) a control valve for controlling a supply of pressurized cooling fluid from the pressurized fluid reservoir to the fluid path.

15 Claims, 16 Drawing Sheets

Related U.S. Application Data

(60) Provisional application No. 61/945,916, filed on Feb. 28, 2014.

(51) Int. Cl.
*H01L 23/00* (2006.01)
*H01L 21/67* (2006.01)
*H05K 3/34* (2006.01)
*B32B 37/00* (2006.01)
*B32B 37/06* (2006.01)

(52) U.S. Cl.
CPC ............... *H01L 2224/75981* (2013.01); *H01L 2224/81048* (2013.01); *H01L 2224/81092* (2013.01); *H01L 2224/81193* (2013.01); *H01L 2224/81204* (2013.01); *H01L 2224/81815* (2013.01); *H01L 2224/81948* (2013.01); *H05K 2203/0475* (2013.01)

THERMOCOMPRESSION BONDING SYSTEMS AND METHODS OF OPERATING THE SAME

CROSS REFERENCE TO RELATED APPLICATION

This application is a divisional of U.S. patent application Ser. No. 14/627,210, filed Feb. 20, 2015, which claims the benefit of U.S. Provisional Patent Application No. 61/945,916 filed Feb. 28, 2014, the contents of which are incorporated herein by reference.

FIELD OF THE INVENTION

The present invention relates to the formation of electrical interconnections in semiconductor packages, and more particularly, to improved thermocompression bonding systems and methods of operating the same.

BACKGROUND OF THE INVENTION

In certain aspects of the semiconductor packaging industry, semiconductor elements are bonded to bonding locations. For example, in conventional die attach (also known as die bonding) applications, a semiconductor die is bonded to a bonding location of a substrate (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, etc.). Conductive structures (e.g., conductive bumps, contact pads, solder bumps, conductive pillars, copper pillars, etc.) provide electrical interconnection between the semiconductor elements and the bonding locations. In certain applications these conductive structures may provide electrical interconnections analogous to wire loops formed using a wire bonding machine.

In many applications (e.g., thermocompression bonding of semiconductor elements), solder material is included in the conductive structures. In many such processes, heat is applied to the semiconductor element being bonded (e.g., through a heater in a bond head assembly carrying the bond tool). It is important that the application of heat be accomplished quickly, such that the machine throughput (e.g., UPH, or units per hour) is at an acceptable level. This can be challenging as the heater (or parts of the heater) is desirably at different temperatures at different times/locations (e.g., a cooler temperature during removal of the component from a source, such as a wafer, as opposed to a warmer temperature at the time of thermocompressive bonding).

Thus, it would be desirable to provide improved methods for operating bonding machines for bonding semiconductor elements.

SUMMARY OF THE INVENTION

According to an exemplary embodiment of the present invention, a thermocompression bonding system for bonding semiconductor elements is provided. The thermocompression bonding system includes (1) a bond head assembly including a heater for heating an semiconductor element to be bonded, the bond head assembly including a fluid path configured to receive a cooling fluid; (2) a pressurized cooling fluid source; (3) a booster pump for receiving a pressurized cooling fluid from the pressurized cooling fluid source, and for increasing a pressure of the received pressurized cooling fluid; (4) a pressurized fluid reservoir for receiving pressurized cooling fluid from the booster pump; and (5) a control valve for controlling a supply of pressurized cooling fluid from the pressurized fluid reservoir to the fluid path.

According to another exemplary embodiment of the present invention, another thermocompression bonding system for bonding semiconductor elements is provided. The thermocompression bonding system includes: a bond head assembly including a heater for heating a semiconductor element to be bonded, the bond head assembly including a fluid path configured to receive a cooling fluid; a pressurized cooling fluid source; a flow control valve for controlling a supply of pressurized cooling fluid from the pressurized fluid source to the fluid path; and a computer for controlling the flow control valve, the computer being configured to control the supply of pressurized cooling fluid provided to the fluid path to be different during different stages of a cooling process of a thermocompression bonding process. Such a thermocompression bonding system may also include various other elements described herein including, for example, a booster pump, a pressurized fluid reservoir, a control valve (e.g., a digital on/off valve), a temperature sensor, amongst others.

According to yet another exemplary embodiment of the present invention, a method of operating a thermocompression bonding machine is provided. The method includes the steps of: (a) providing a pressurized cooling fluid source; (b) increasing a pressure of a pressurized cooling fluid from the pressurized cooling fluid source using a booster pump; (c) receiving pressurized cooling fluid from the booster pump at a pressurized fluid reservoir; and (d) controlling, with a control valve, a flow of the pressurized cooling fluid from the pressurized fluid reservoir to a fluid path included in a bond head assembly of the thermocompression bonding machine.

According to yet another exemplary embodiment of the present invention, a method of operating a thermocompression bonding system is provided. The method includes the steps of: (a) providing a pressurized cooling fluid source; and (b) controlling, with a flow control valve, a supply of pressurized cooling fluid from the pressurized cooling fluid source to a fluid path included in a bond head assembly of the thermocompression bonding system, the supply of pressurized cooling fluid provided to the fluid path being controlled by the flow control valve to be different during different stages of a cooling process of a thermocompression bonding process. Of course, such a method may include other steps as described herein.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

Figure 1A:
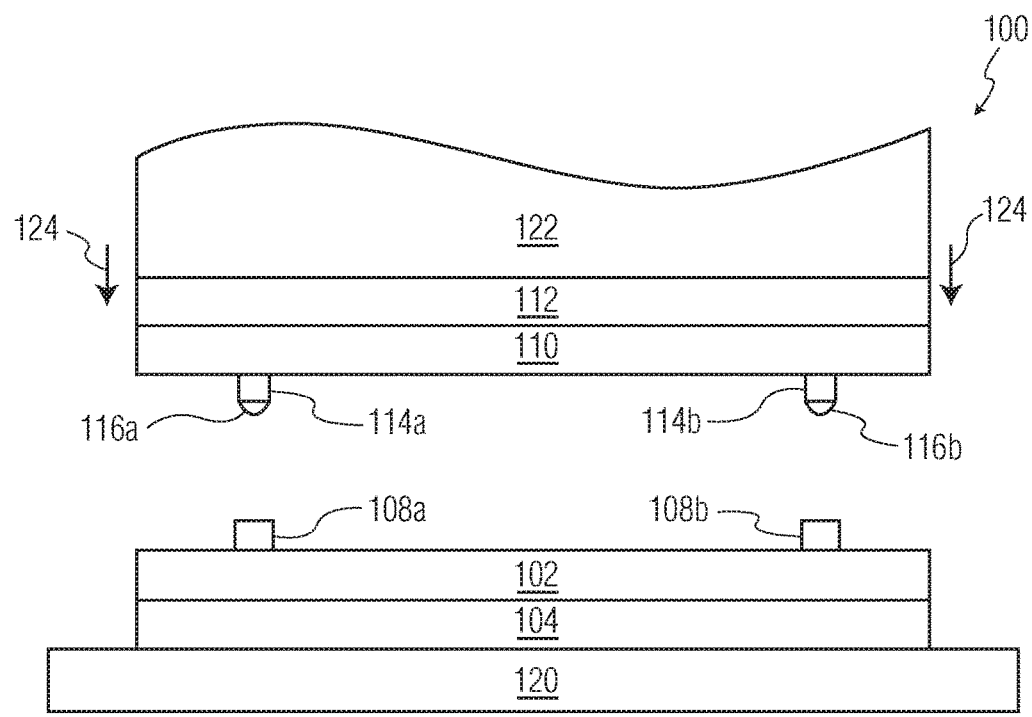
FIGS. 1A-1B are block diagram views of portions of an thermocompression bonding machine illustrating a structure and method of bonding a semiconductor element to a substrate in accordance with an exemplary embodiment of the present invention.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semicondcutor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the terms "substrate" and "workpiece" are intended to refer to any structure to which a semiconductor element may be bonded (e.g., thermocompressively bonded, ultrasonically bonded, thermosonically bonded, die bonded, etc.). Exemplary substrates include, for example, a leadframe, a PCB, a carrier, a semiconductor chip, a semicondcutor wafer, a BGA substrate, a semiconductor element, etc.

In accordance with certain aspects of the present invention, thermocompression bonding systems utilizing heat in a bond head assembly, for example, for melting and/or softening of a solder material included as part of the interconnects of a semiconductor element to be bonded, are disclosed. A bond tool (which may be distinct from the heater, or which may be part of the heater) carried by the bond head assembly places and bonds a semiconductor element to a substrate by melting and re-solidifying solder bumps on the semiconductor element being placed/bonded. In order to melt the solder bumps, it is important to be able to rapidly heat the bond tool. It is also desirable to be able to rapidly cool the bond tool while maintaining the position of the semiconductor element being bonded (e.g., to single digit micron, or smaller, levels). Thus, it is desirable that thermocompression bonding systems (and related processes) be capable of precise control of the bond tool temperature during all phases of the bonding process (e.g., during the heating phase/process, during the cooling phase/process, etc.).

According to various aspects of the present invention, the bond head temperature (e.g., part of the bond head such as the heater/bond tool) may be controlled during the cooling phase/process of a thermocompression bonding process. For example, according to certain exemplary embodiments of the present invention, the flow rate of pressurized cooling fluid may be controlled (e.g., controlled to be a variable cooling rate as commanded by a computer program, for example, using a command profile with a measured temperature as a feedback signal) using an analog flow control valve. This may be particularly beneficial because during a thermocompression bonding process there are often times when cooling rates other than maximum system capability are desired for the control of the bonding process. For example, during the initial solidification (i.e., re-solidification after melting) of the solder, highly controlled (and repeatable) cooling is desirable to provide bonded interconnections of a substantially consistent quality.

A temperature sensor (e.g., a feedback sensor positioned to sense the temperature of, for example, a lower surface of the heater/bond tool) may be provided within a thermocompression bond head assembly during a commanded rapid cooling stage of a cooling process (e.g., 100-150° C. over a 1 second period). Such feedback controlled cooling may be used in connection with a multi-stage cooling process as described herein (e.g., a first controlled cooling stage at less than maximum cooling, and a second cooling stage at maximum cooling).

Further, such feedback controlled cooling may also be used at various times during a thermocompression bonding process. For example, a certain amount of heat (thermal energy) remains within portions of the bond head assembly not directly measured by the temperature feedback sensor. This thermal energy will gradually move from the warmer bodies to the just cooled body (e.g., the heater/bond tool). This appears as a drift of temperature on the temperature feedback device. In such a circumstance, it may be undesirable to use a digital (e.g., on/off) cooling system in this circumstance as the amount of cooling is not easily controlled, resulting in a portion of the bond head assembly being cooled to an undesirable amount.

According to various aspects of the present invention, a booster pump (e.g., a mechanical pressure booster) may be provided to increase the incoming pressurized cooling fluid above that which is normally available (e.g., factory compressed air). Such an increase in the incoming pressure may be used to overcome pressure drop in small channels in the heater. The pressure drops though such channels, primarily caused by friction of the channel walls, causes the fluid velocity to drop rapidly leading to a loss of cooling efficiency. Such a loss may be mitigated by the use of higher pressure fluid. Often the pressure available in a facility (e.g., compressed air) is not high enough to provide maximum cooling. By providing a pressure booster, the input cooling fluid pressure may be raised to a desired level (e.g., a pressure increase of at least 50%, a pressure increase of at least 100%, etc., with a specific example being a 100% increase such as an increase from 0.6 MPa to 1.2 MPa).

Figure 1B:
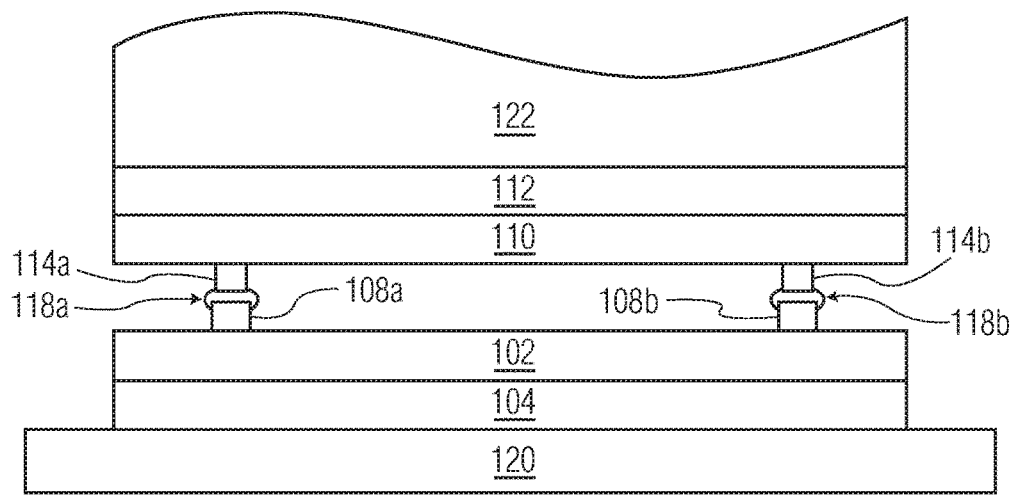

Referring now to the drawings, FIG. 1A illustrates portions of bonding machine 100 (e.g., a thermocompression flip chip bonding machine) including bond stage 120 (e.g., a shuttle, a heated shuttle, a heat block, an anvil, etc.), and support structure 104 supported by bond stage 120 (where support structure 104 and bond stage 120 may be integrated into a single element). As will be appreciated by those skilled in the art, support structure 104 may be referred to as an application specific part (sometimes referred to in the industry as a p-part). Substrate 102 is supported by support structure 104, and is configured to receive at least one semiconductor element through a thermocompression bonding process. Lower conductive structures 108a, 108b (e.g., conductive traces, conductive pads, etc.) are provided on substrate 102. Bonding machine 100 also includes bond head assembly 122 which carries heated bond tool 112 that carries semiconductor element 110. Upper conductive structures 114a, 114b (e.g., conductive pillars such as copper pillars, shown including solder contact portions 116a, 116b) are provided on semiconductor element 110. Bond tool 112 is lowered such that upper conductive structures 114a, 114b contact lower conductive structures 108a, 108b (e.g., see FIG. 1B). As illustrated in FIG. 1B, through a thermocompressive bonding process, solder contact portions 116a, 116b are softened, and then re-solidified as solder interfaces 118a, 118b, providing a permanent conductive coupling between ones of upper conductive structures 114a, 114b and respective lower conductive structures 108a, 108b. Although FIGS. 1A-1B illustrate only two pairs of conductive structures (pair 114a, 108a and pair 114b, 108b), this is of course a simple example for ease of explanation. In practice, any number of pairs of conductive structures may be provided (e.g., tens of conductive structure pairs, hundreds of conductive structure pairs, etc.).

Figure 2:
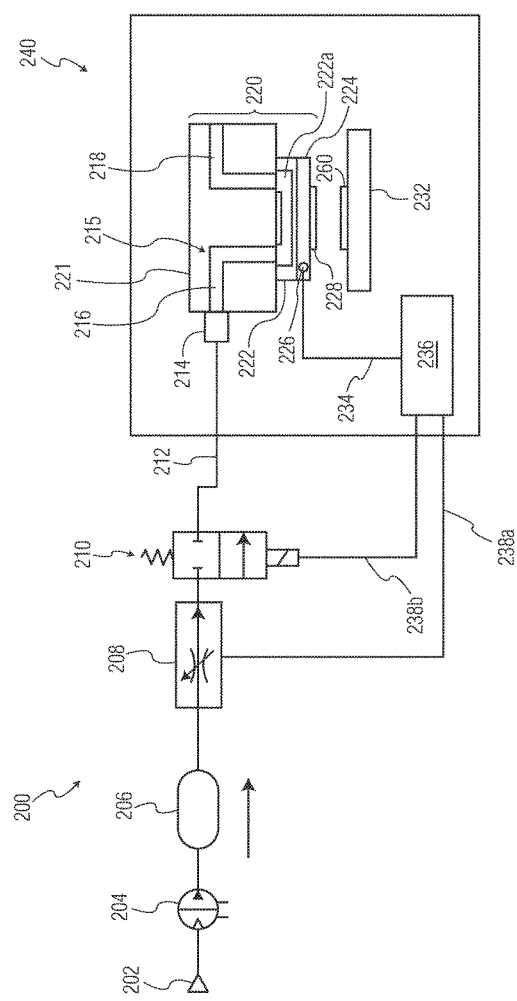
FIGS. 2-7 are block diagram views illustrating thermocompression bonding systems in accordance with various exemplary embodiments of the present invention.

FIG. 2 illustrates exemplary thermocompression bonding system 200 including thermocompression bonding machine 240. Machine 240 includes bond head assembly 220 including upper structure 221 (including various elements, not shown), cooling structure 222 and heater 224. Heater 224 is in contact with semiconductor element 228 (e.g., a semiconductor die to be bonded). As will be appreciated by those skilled in the art, heater 224 may be a heated bond tool configured to carry and bond semiconductor element 228 to workpiece 260. As will be appreciated by those skilled in the art, heater 224 may be considered a heated bond tool (similar to tool 112 illustrated in FIGS. 1A-1B). That is, the terms heater and bond tool may be used interchangeably, and may be integrated into a single component (as shown in the exemplary embodiment illustrated in FIGS. 1A-1B and FIGS. 2-7) or may be multiple separate components. Machine 240 also includes computer 236, and bond stage 232 for supporting workpiece 260. Temperature sensor 226 measures the temperature of heater 224, and provides information related to this temperature back to computer 236 as temperature signal 234.

Thermocompression bonding system 200 also includes an element for providing a pressurized cooling fluid (e.g., compressed air) to bond head 220 for cooling heater/bond tool 224 as part of a thermocompression bonding process. More specifically, system 200 includes pressurized cooling fluid source 202 (e.g., a factory compressed air source, such as piping from a compressed air tank or compressor, etc.) for providing pressurized cooling fluid to booster pump 204. Booster pump 204 receives pressurized cooling fluid from source 202, and increases a pressure of the received pressurized cooling fluid. In certain exemplary embodiments of the present invention, booster pump 204 increases the pressure of the pressurized cooling fluid from source 202 by at least 50%, by at least 100%, etc. In one very specific example, pressurized cooling fluid from source 202 is provided at a pressure of approximately 0.6 MPa, and booster pump 204 increases the pressure of the pressurized cooling fluid to approximately 1.2 MPa (e.g., a pressure increase of approximately 100%). The pressurized cooling fluid (at the now increased pressure) is then received by pressurized fluid reservoir 206 (e.g., a compressed air tank). Pressurized fluid from reservoir 206 is received by flow control valve 208 (e.g., an analog control valve), where flow control valve 208 is configured to adjust a pressure of the pressurized cooling fluid provided to bond head assembly 220. Downstream of flow control valve 208 is control valve 210 (e.g., an on/off digital valve) for controlling a supply of pressurized cooling fluid to bond head assembly 220. Flow control valve 208 and control valve 210 are each controlled by computer 236 (as shown by respective control signals 238a, 238b). Downstream of valve 210, the pressurized cooling fluid travels within fluid path 212 until it reaches inlet 214 of bond head assembly 220. Fluid path 215 is included within bond head assembly 220, and includes inlet fluid path 216 (defined by upper structure 221), cooling path 222a (defined by cooling structure 222), and outlet fluid path 218 (defined by upper structure 221).

In accordance with the exemplary embodiments of the present invention illustrated and described in connection with FIGS. 2-7, various elements are described as being part of a thermocompression bonding system (e.g., systems 200, 300, 400, 500, 600, and 700) but distinct from the corresponding thermcompression bonding machine (e.g., machines 240, 340, 440, 540, 640, and 740). Examples of such elements in FIG. 2 are elements 204, 206, 208, and 210. In accordance with the present invention, any or all of such elements may be included in the corresponding thermocompression bonding machine.

Each of FIGS. 3-7 illustrate systems similar to system 200 shown in FIG. 2, with like elements being numbered including the same reference number except with a different initial digit. For example, the bond head assemblies are numbered as element 220 (in FIG. 2), element 320 (in FIG. 3), element 420 (in FIG. 4), element 520 (in FIG. 5), element 620 (in FIG. 6), element 720 (in FIG. 7). Absent a difference noted below, the element (and its function) is substantially similar to those described in FIG. 2.

Figure 3:
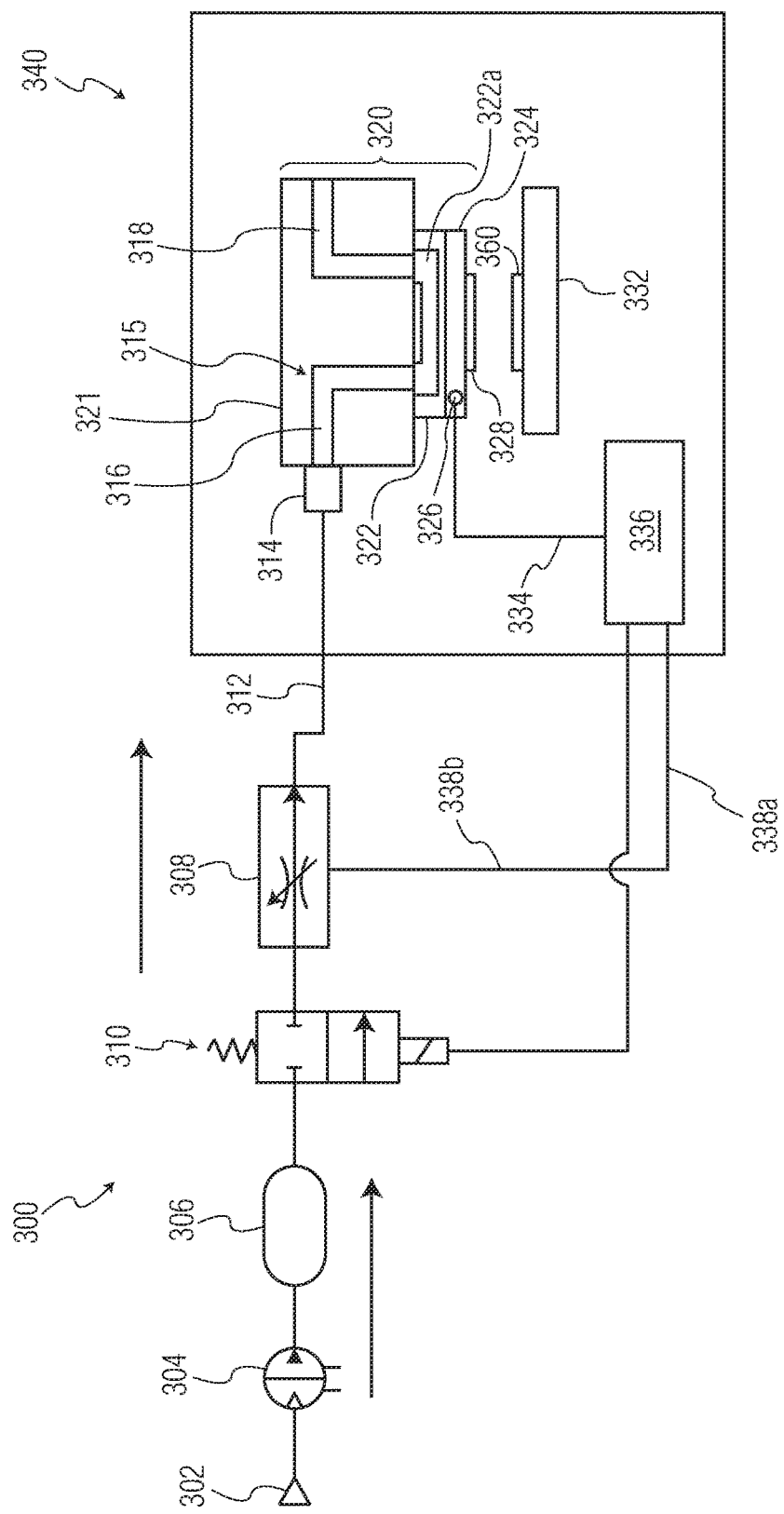

Referring specifically to FIG. 3, the primary difference compared to FIG. 2 is that flow control valve 308 is positioned downstream of control valve 310 (as opposed to flow control valve 208 being positioned upstream of control valve 210 in FIG. 2). FIG. 3 illustrates exemplary thermocompression bonding system 300 including thermocompression bonding machine 340. Machine 340 includes bond head assembly 320 including upper structure 321, cooling structure 322 and heater 324. Heater 324 is in contact with semiconductor element 328. As will be appreciated by those skilled in the art, heater 324 may be a heated bond tool configured to carry and bond semiconductor element 328 to workpiece 360. Machine 340 also includes computer 336, and bond stage 332 for supporting workpiece 360. Temperature sensor 326 measures the temperature of heater 324, and provides information related to this temperature back to computer 336 as temperature signal 334.

Thermocompression bonding system 300 also includes pressurized cooling fluid source 302 for providing pressurized cooling fluid to booster pump 304. Booster pump 304 receives pressurized cooling fluid from source 302, and increases a pressure of the received pressurized cooling fluid (e.g., by at least 50%, by at least 100%, etc.). The pressurized cooling fluid (at the now increased pressure) is then received by pressurized fluid reservoir 306. Pressurized fluid from reservoir 306 is received by control valve 310 (e.g., an on/off digital valve) for controlling a supply of pressurized cooling fluid to bond head assembly 320. Downstream of control valve 310 is flow control valve 308 (e.g., an analog control valve), where flow control valve 308 is configured to adjust a pressure of the pressurized cooling fluid provided to bond head assembly 320. Control valve 310 and flow control valve 308 are each controlled by computer 336, as shown by respective control signals 338a, 338b). Downstream of flow control valve 308, the pressurized cooling fluid travels within fluid path 312 until it reaches inlet 314 of bond head assembly 320. Fluid path 315 is included within bond head assembly 320, and includes inlet fluid path 316 (defined by upper structure 321), cooling path 322a (defined by cooling structure 322), and outlet fluid path 318 (defined by upper structure 321).

Figure 4:
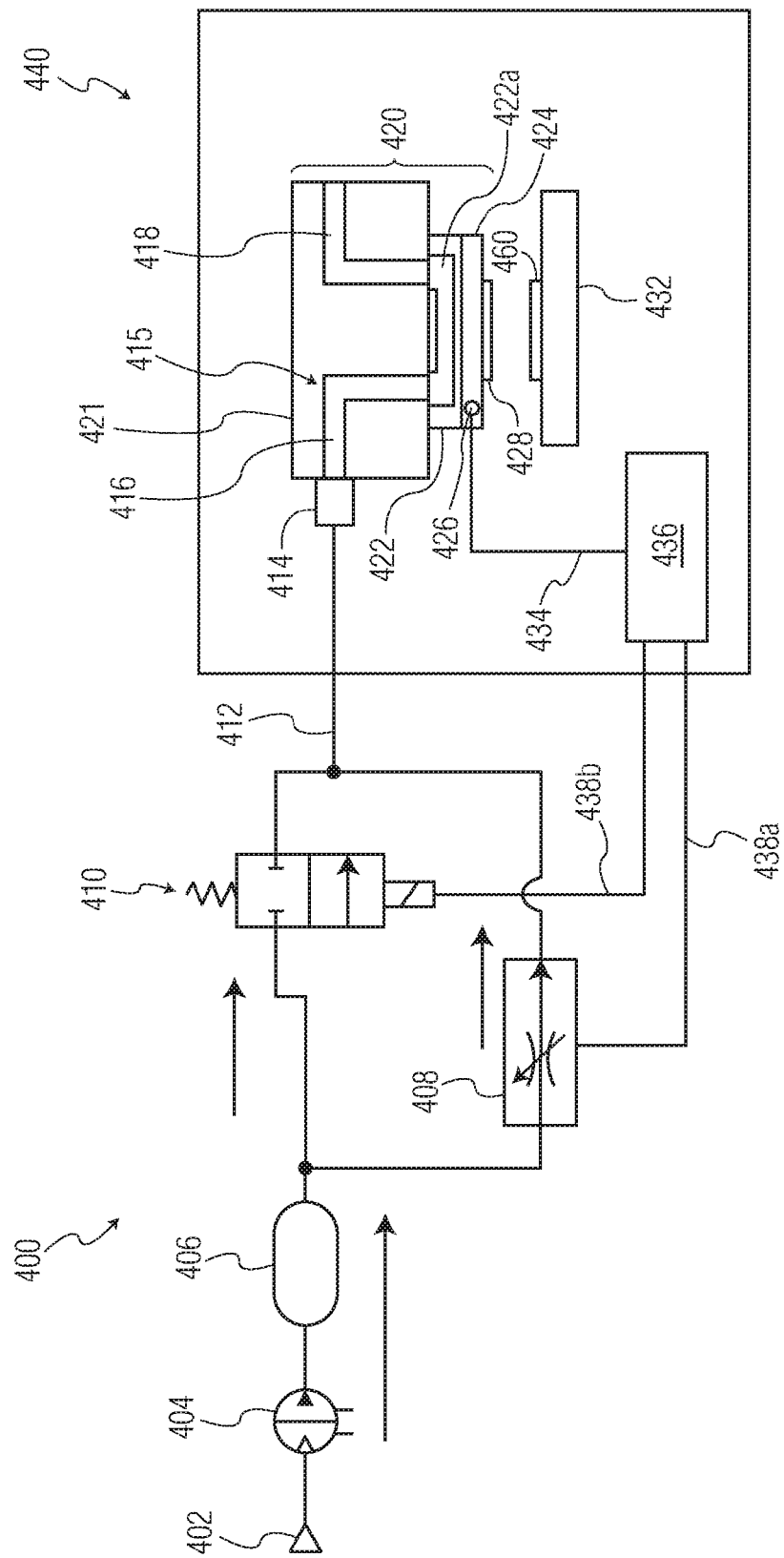

Referring specifically to FIG. 4, the primary difference compared to FIGS. 2-3 is that flow control valve 408 is in a parallel fluid path with a fluid path including control valve 410 (as opposed to flow control valves 208/308 being in line with control valves 210/310 in FIGS. 2-3, respectively). FIG. 4 illustrates exemplary thermocompression bonding system 400 including thermocompression bonding machine 440. Machine 440 includes bond head assembly 420 including upper structure 421, cooling structure 422 and heater 424. Heater 424 is in contact with semiconductor element 428. As will be appreciated by those skilled in the art, heater 424 may be a heated bond tool configured to carry and bond semiconductor element 428 to workpiece 460. Machine 440 also includes computer 436, and bond stage 432 for supporting workpiece 460. Temperature sensor 426 measures the temperature of heater 424, and provides information related to this temperature back to computer 436 as temperature signal 434.

Thermocompression bonding system 400 also includes pressurized cooling fluid source 402 for providing pressurized cooling fluid to booster pump 404. Booster pump 404 receives pressurized cooling fluid from source 402, and increases a pressure of the received pressurized cooling fluid (e.g., by at least 50%, by at least 100%, etc.). The pressurized cooling fluid (at the now increased pressure) is then received by pressurized fluid reservoir 406. Pressurized fluid from reservoir 406 may flow in either of two directions (or perhaps both, if desired): a first direction through control valve 410 (e.g., an on/off digital valve) to fluid path 412; and a second direction through flow control valve 408 (e.g., an analog control valve) to fluid path 412. For example, depending upon the specific application (and/or depending on the timing/stage of a bonding process), it may be desirable to have a continuous maximum flow of pressurized cooling fluid, in which case control valve 410 may be open (and flow control valve 408 is closed). In another application, (and/or depending on the timing/stage of a bonding process), it may be desirable to have a controlled (e.g., analog controlled) flow of pressurized cooling fluid at a specific pressure value, in which case control valve 410 may be closed (and flow control valve 408 open at selected positions to provide the desired pressure values). Flow control valve 408 and control valve 410 are each controlled by computer 436, as shown by respective control signals 438a, 438b). Regardless of which direction the pressurized cooling fluid flows (i.e., either through valve 410, or through valve 408), the pressurized cooling fluid travels within fluid path 412 until it reaches inlet 414 of bond head assembly 420. Fluid path 415 is included within bond head assembly 420, and includes inlet fluid path 416 (defined by upper structure 421), cooling path 422a (defined by cooling structure 422), and outlet fluid path 418 (defined by upper structure 421).

Figure 5:
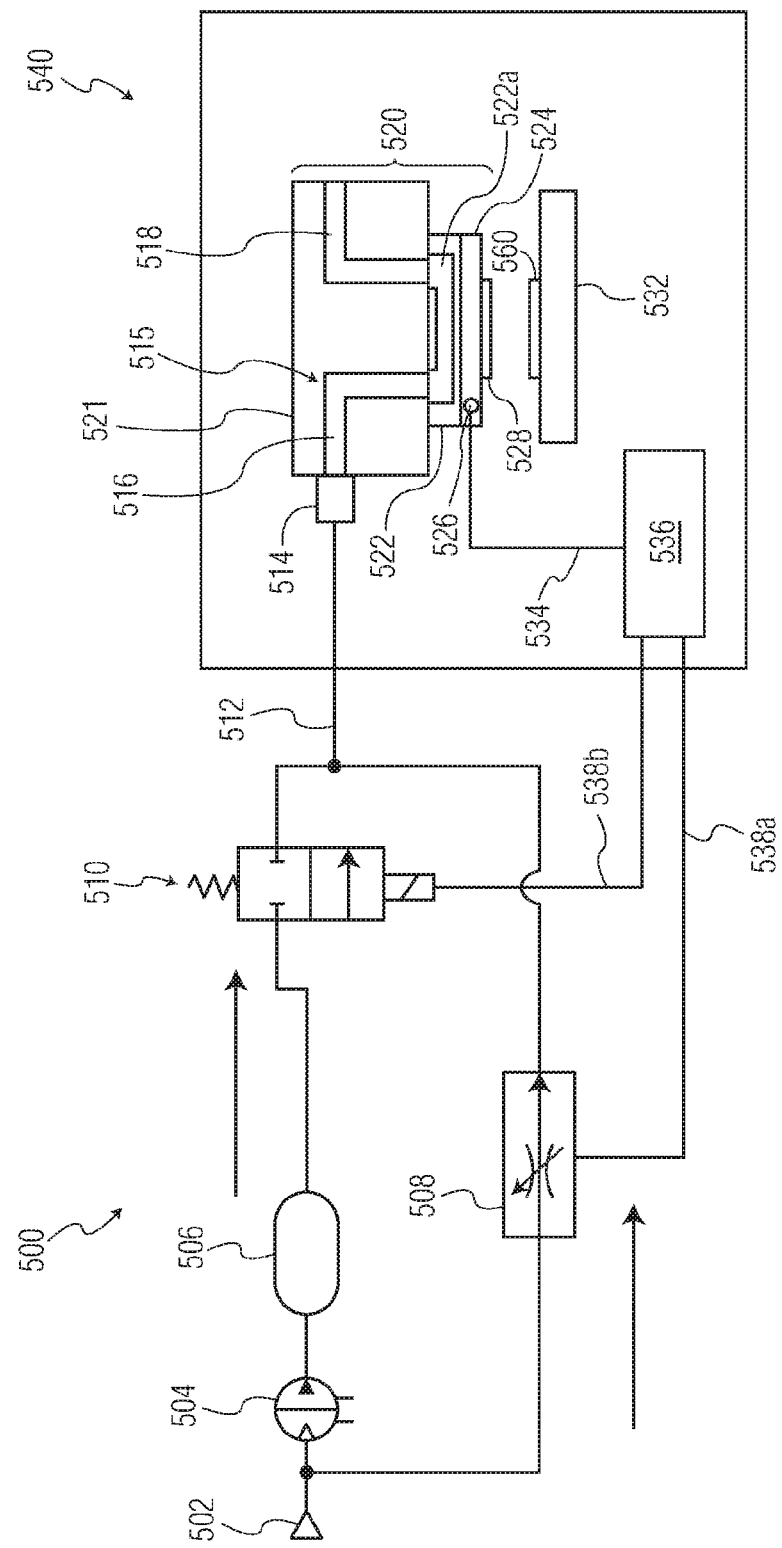

In FIG. 4, it is noteworthy that flow control valve 408 receives pressurized cooling fluid after the pressure of the fluid has been increased by booster pump 404. Thus, depending on design considerations, flow control valve 408 may be able to provide pressurized cooling fluid at a pressure level up to the maximum output pressure of booster pump 406 (e.g., or as low as desired given design constraints, using analog control). Referring specifically to FIG. 5, the primary difference compared to FIG. 4 is that flow control valve 508 receives its input cooling fluid from source 502 before the pressure of the fluid has been increased by booster pump 504. Therefore, the pressurized cooling fluid is provided at a lower pressure (as opposed to FIG. 4, where the input cooling fluid from source 402 is provided at a higher level, downstream of booster pump 404).

FIG. 5 illustrates exemplary thermocompression bonding system 500 including thermocompression bonding machine 540. Machine 540 includes bond head assembly 520 including upper structure 521, cooling structure 522 and heater 524. Heater 524 is in contact with semiconductor element 528. As will be appreciated by those skilled in the art, heater 524 may be a heated bond tool configured to carry and bond semiconductor element 528 to workpiece 560. Machine 540 also includes computer 536, and bond stage 532 for supporting workpiece 560. Temperature sensor 526 measures the temperature of heater 524, and provides information related to this temperature back to computer 536 as temperature signal 534.

Thermocompression bonding system 500 also includes pressurized cooling fluid source 502 for providing pressurized cooling fluid to booster pump 504, and/or to flow control valve 508. Booster pump 504 receives pressurized cooling fluid from source 502, and increases a pressure of the received pressurized cooling fluid (e.g., by at least 50%, by at least 100%, etc.). The pressurized cooling fluid (at the now increased pressure) is then received by pressurized fluid reservoir 506. Pressurized fluid from reservoir 506 flows through control valve 510 (e.g., an on/off digital valve) to fluid path 512. For example, depending upon the specific application (and/or depending on the timing/stage of a bonding process), it may be desirable to have a continuous maximum flow of pressurized cooling fluid, in which case control valve 510 may be open (and flow control valve 508 is closed). In another application, (and/or depending on the timing/stage of a bonding process), it may be desirable to have a controlled (e.g., analog controlled) flow of pressurized cooling fluid at a specific pressure value, in which case control valve 510 may be closed (and flow control valve 508 open at selected positions to provide the desired flow values). Flow control valve 508 and control valve 510 are each controlled by computer 536, as shown by respective control signals 538a, 538b). Regardless of which valve controls the flow of the pressurized cooling fluid (i.e., valve 510 or valve 508), the pressurized cooling fluid travels within fluid path 512 until it reaches inlet 514 of bond head assembly 520. Fluid path 515 is included within bond head assembly 520, and includes inlet fluid path 516 (defined by upper structure 521), cooling path 522a (defined by cooling structure 522), and outlet fluid path 518 (defined by upper structure 521).

Figure 6:
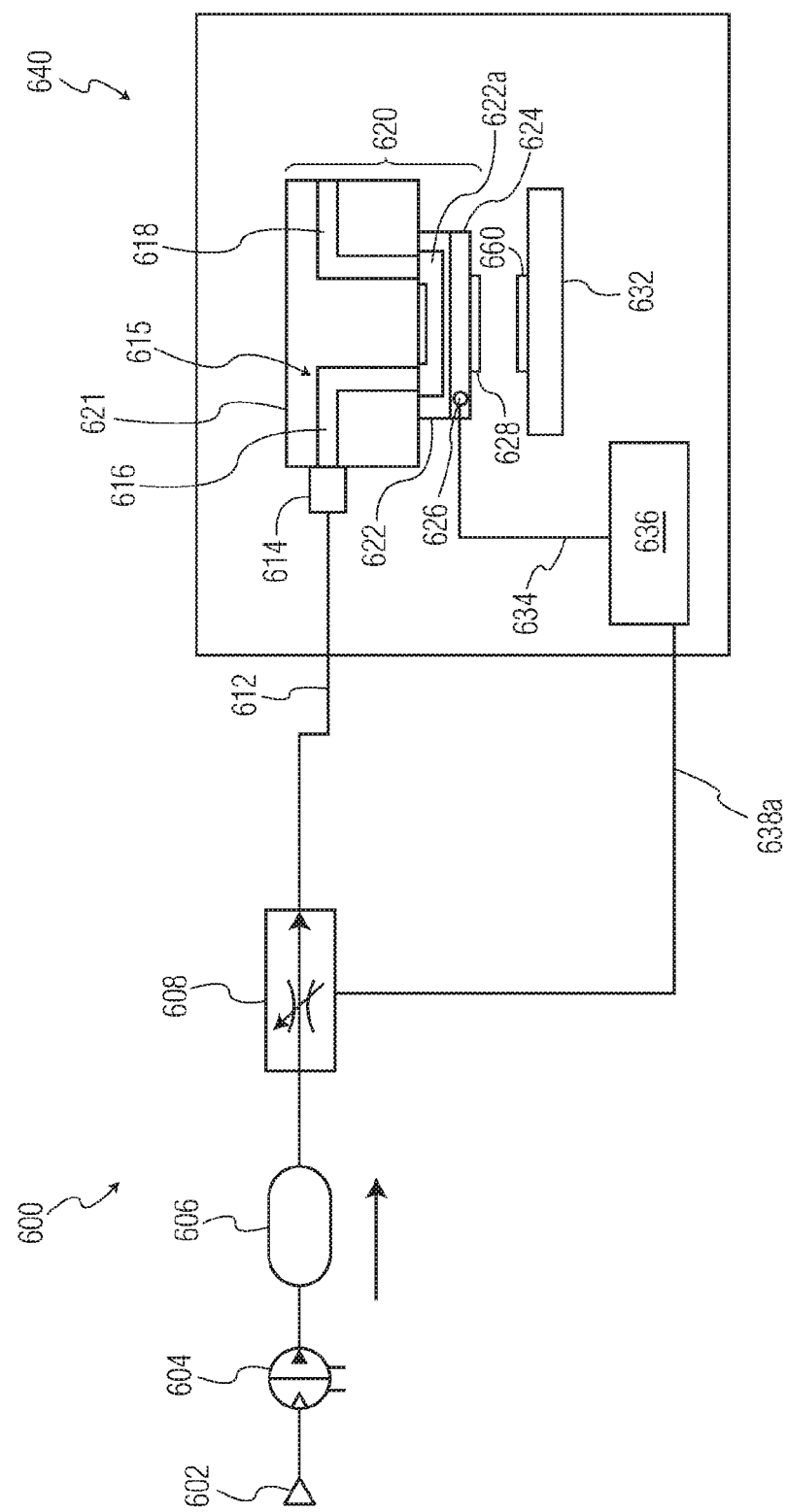
Figure 7:
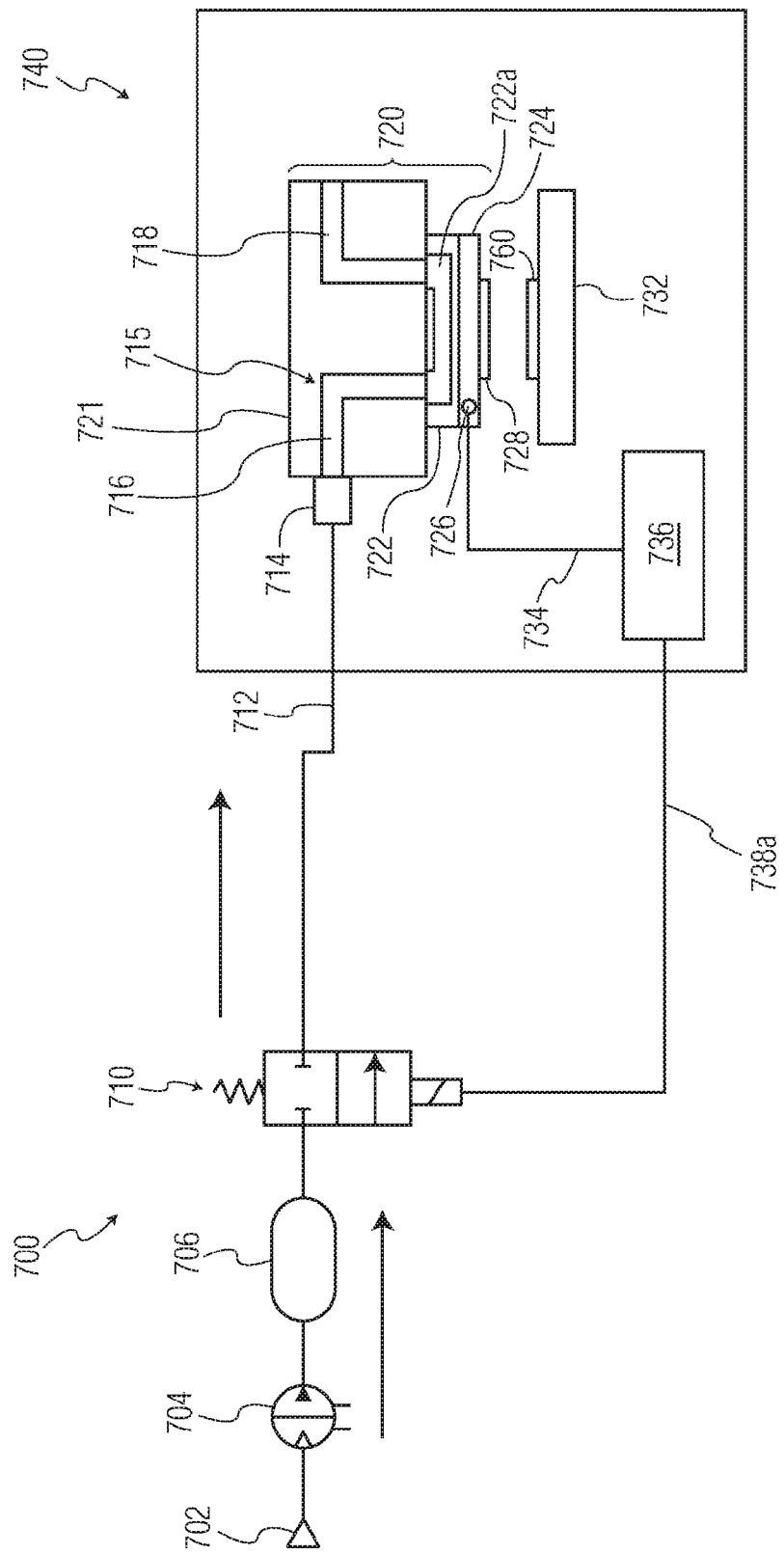

Each of the exemplary configurations shown in FIGS. 2-5 illustrate thermocompression bonding systems including distinct control valves (e.g., digital "on/off" valves) and flow control valves (e.g., analog control valves for controlling the supply of a pressurized cooling fluid according to a computer program of other profile). As will be appreciated by those skilled in the art, certain aspects of the present invention may be achieved with only one of these two valves included in the system. FIGS. 6-7 illustrate two examples of such an arrangement.

Referring specifically to FIG. 6, the primary difference compared to FIG. 4 is that control of the pressurized cooling fluid is controlled by flow control valve 608 and not a corresponding digital on/off control valve (as opposed to FIG. 4, which includes both analog flow control valves 408 as well as an on/off control valve 410). For example, one might consider an arrangement where a flow control valve is provided that is robust enough to control the flow/supply of pressurized cooling fluid during all stages of a cooling phase/process of a thermocompression bonding process.

FIG. 6 illustrates exemplary thermocompression bonding system 600 including thermocompression bonding machine 640. Machine 640 includes bond head assembly 620 including upper structure 621, cooling structure 622 and heater 624. Heater 624 is in contact with semiconductor element 628. As will be appreciated by those skilled in the art, heater 624 may be a heated bond tool configured to carry and bond semiconductor element 628 to workpiece 660. Machine 640 also includes computer 636, and bond stage 632 for supporting workpiece 660. Temperature sensor 626 measures the temperature of heater 624, and provides information related to this temperature back to computer 636 as temperature signal 634.

Thermocompression bonding system 600 also includes pressurized cooling fluid source 602 for providing pressurized cooling fluid to booster pump 604. Booster pump 604 receives pressurized cooling fluid from source 602, and increases a pressure of the received pressurized cooling fluid (e.g., by at least 50%, by at least 100%, etc.). The pressurized cooling fluid (at the now increased pressure) is then received by pressurized fluid reservoir 606. Pressurized cooling fluid is directed from reservoir 606 to flow control valve 608. Flow control valve 608 controls the supply of pressurized cooling fluid (e.g., analog control according to a computer program where the flow/supply may be varied depending on the timing/stage of a bonding process). Pressurized cooling fluid that passes through flow control valve 608 travels within fluid path 612 until it reaches inlet 614 of bond head assembly 620. Fluid path 615 is included within bond head assembly 620, and includes inlet fluid path 616 (defined by upper structure 621), cooling path 622a (defined by cooling structure 622), and outlet fluid path 618 (defined by upper structure 621).

Referring specifically to FIG. 7, the primary difference compared to FIG. 6 is that control of the pressurized cooling fluid is controlled by control valve 710 and not a corresponding analog flow control valve (as opposed to FIG. 6, which includes flow control valve 608). For example, one might consider an application where analog control of the supply of pressurized cooling fluid is not needed or desired, and that the addition of a booster pump to increase the fluid pressure provides the desired cooling via a simple digital on/off control valve. FIG. 7 illustrates exemplary thermocompression bonding system 700 including thermocompression bonding machine 740. Machine 740 includes bond head assembly 720 including upper structure 721, cooling structure 722 and heater 724. Heater 724 is in contact with semiconductor element 728. As will be appreciated by those skilled in the art, heater 724 may be a heated bond tool configured to carry and bond semiconductor element 728 to workpiece 760. Machine 740 also includes computer 736, and bond stage 732 for supporting workpiece 760. Temperature sensor 726 measures the temperature of heater 724, and provides information related to this temperature back to computer 736 as temperature signal 734.

Thermocompression bonding system 700 also includes pressurized cooling fluid source 702 for providing pressurized cooling fluid to booster pump 704. Booster pump 704 receives pressurized cooling fluid from source 702, and increases a pressure of the received pressurized cooling fluid (e.g., by at least 50%, by at least 100%, etc.). The pressurized cooling fluid (at the now increased pressure) is then received by pressurized fluid reservoir 706. Pressurized cooling fluid is directed from reservoir 706 to control valve 710. Control valve 710 controls the flow of pressurized cooling fluid (e.g., "on/off" digital control according to a computer program). Pressurized cooling fluid that passes through control valve 710 travels within fluid path 712 until it reaches inlet 714 of bond head assembly 720. Fluid path 715 is included within bond head assembly 720, and includes inlet fluid path 716 (defined by upper structure 721), cooling path 722a (defined by cooling structure 722), and outlet fluid path 718 (defined by upper structure 721).

As will be appreciated by those skilled in the art, the systems illustrated in FIGS. 2-7 may include additional elements, or less elements, according to certain exemplary embodiments of the present invention. An example of an additional element(s) may be a check valve for preventing reverse flow of pressurized cooling fluid. An example of an element(s) that may be removed from one of the systems depending on the specific application may be the booster pump, the pressurized fluid reservoir, amongst others.

Each of FIGS. 2-7 illustrate exemplary fluid paths 215, 315, 415, 515, 615, and 715 included within the respective bond head assembly. These fluid paths have each been illustrated in a simple manner to include an inlet fluid path, a cooling path defined by a cooling structure, and an outlet fluid path; however, and as will be appreciated by those skilled in the art, the fluid path may be much more complex than those illustrated. That is, in thermocompression bonding systems, rapid heating and cooling of portions of the bond head assembly may be critical. Complex cooling systems, including many fluid channels, may be utilized.

Figure 8:
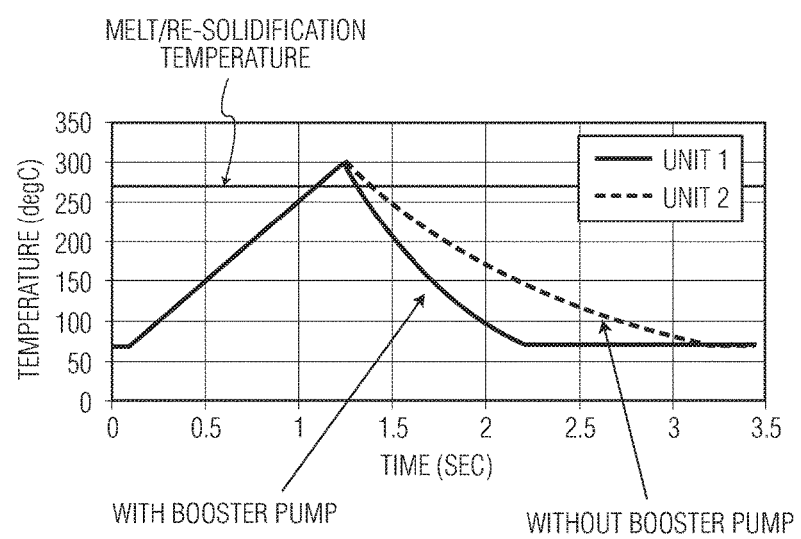
FIG. 8, FIGS. 9A-9B, FIG. 10, and FIG. 11 are graphical illustrations of temperature profiles of elements of thermocompression bonding systems in accordance with various exemplary embodiments of the present invention.

Certain of the benefits of various exemplary embodiments of the present invention are graphically shown in FIG. 8, FIGS. 9A-9B, FIG. 10, and FIG. 11. Referring specifically to FIG. 8, a time versus temperature plot is provided showing heating and cooling of solder material included in interconnections formed in a thermocompression bonding process (e.g., similar to solder material 116a, 116b shown in FIG. 1A) for two different types of thermocompressive bonding systems. In this illustration, the "Unit 1" system includes a booster pump (similar to booster pumps 204, 304, 404, 504, 604 and 704 illustrated in FIGS. 2-7, respectively). The "Unit 2" system does not includes such a booster pump, but rather relies on factory compressed air pressure. In this example, for both systems the heating process is identical, but the cooling processes are different because the pressurized cooling fluid in Unit 1 system is provided at a higher pressure. As shown in FIG. 8, the Unit 1 system cools faster compared to the Unit 2 system, and specifically: reaches the critical melt/re-solidification temperature faster; and reaches the process complete temperature (approximately 70 degrees) about 1 second faster (e.g., approximately 2.2 seconds for Unit 1, versus 3.2 seconds for Unit 2). As will be appreciated by those skilled in the art, after this "process complete temperature" is reached further processing (e.g., commencing the process to pick the next semiconductor element to be bonded) may commence. It will be appreciated that further processing (e.g., the process of picking the next semiconductor element to be bonded) may actually be commenced before reaching the "process complete temperature", for example, so long as the re-solidification temperature has been reached. Thus, the faster processing time of the Unit 1 system in accordance with the present invention results in an improved UPH rate.

Figure 9A:
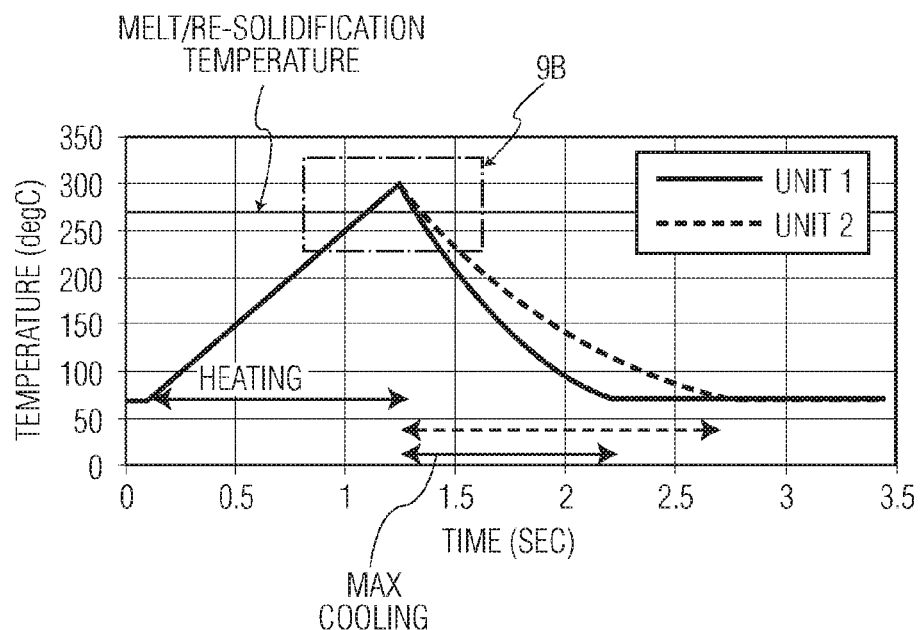
Figure 9B:
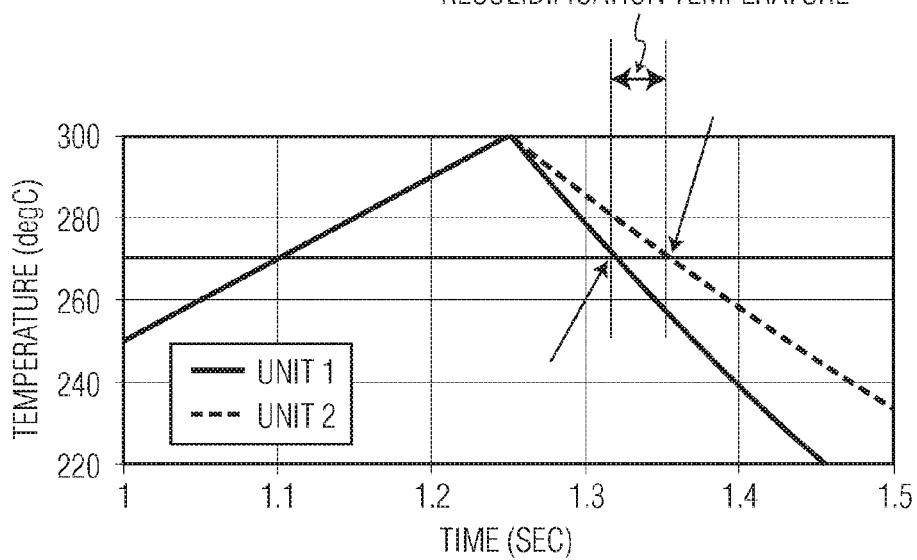

Another important consideration in cooling the heater/bond tool in thermocompression bonding systems relates to process consistency. For example, it is very desirable that each system running the same process to reach the melt/re-solidification temperature at approximately the same time during the process. However, even if designed to be the same, each thermocompression bonding system performs somewhat differently in practice. FIG. 9A illustrates time versus temperature plots for two thermocompression bonding systems (i.e., "Unit 1" and "Unit 2") of the same design. As shown in FIG. 9A, and detailed in FIG. 9B, there is a substantial time difference (i.e., $T_D$) between how long it takes Unit 1, versus how long it takes Unit 2, to reach the re-solidification temperature. While the example shown in FIGS. 9A-9B has a larger than normal variation (for ease of illustrating the problem), the resultant $T_D$ is a real world portability issue in thermocompression bonding.

Figure 10:
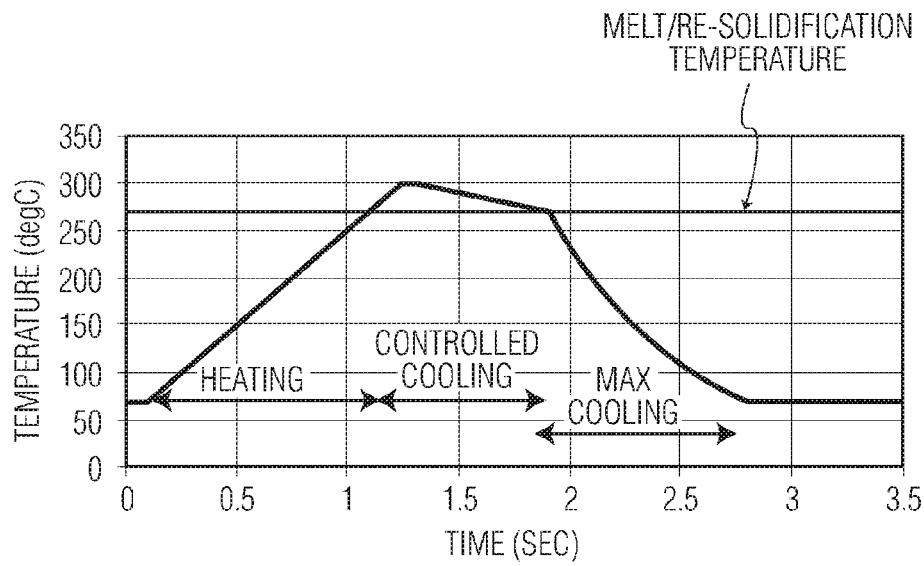
Figure 11:
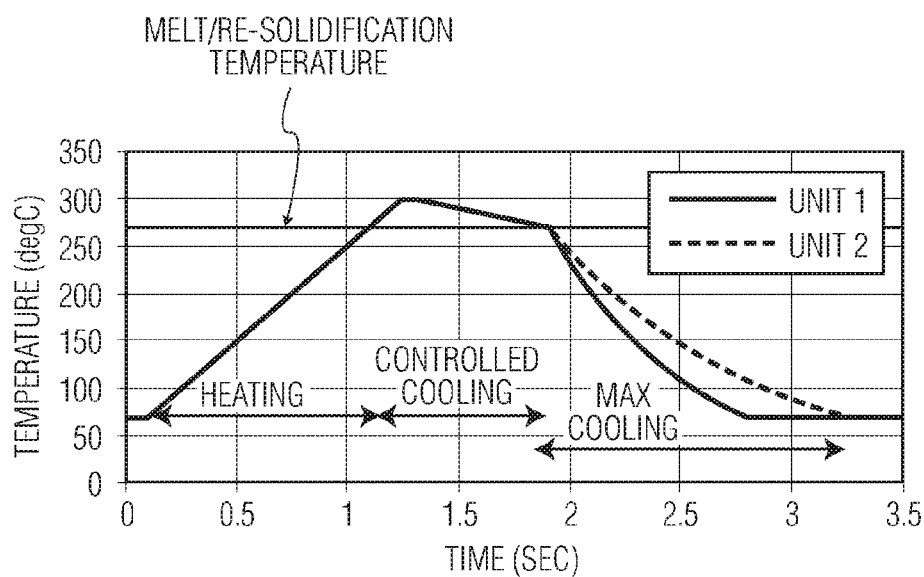

FIG. 10 illustrates a time versus temperature plot for a 2 stage cooling process on a thermocompression bonding system according to the present invention. As shown in FIG. 10, after the "Heating" process is complete at approximately 1.25 seconds, a "Controlled Cooling" stage of the cooling process begins. During this Controlled Cooling stage of the cooling process a cooling rate is defined by a computer program (and may be feedback controlled, with the temperature signal being the feedback signal), and the bond head assembly (including the heater/bond tool) are cooled according to a predetermined cooling profile until a predetermined event occurs (e.g., until a predetermined temperature is detected). In the example shown in FIG. 10, this predetermined event is the cooling process reaching the re-solidification temperature. After reaching the re-solidification temperature, the "Max Cooling" stage of the cooling process begins and the maximum (or a predetermined maximum) amount of cooling is provided in order to reach the process complete temperature (e.g., approximately 70 degrees C. in FIG. 10) as soon as possible. Using such a two stage cooling process, certain portability issues from one thermocompression bonding system to another thermocompression bonding system may be overcome. For example, FIG. 11 illustrates time versus temperature plots for a 2 stage cooling process on 2 different thermocompression bonding systems (i.e., "Unit 1" and "Unit 2"). As shown in FIG. 11, using the 2 stage cooling process, each system is able to reach the re-solidification temperature at approximately the same time.

FIGS. 12-17 illustrate exemplary methods of operating thermocompression bonding systems. As will be appreciated by those skilled in the art, certain steps may be added, certain steps may be deleted, and/or the order of certain of the steps may be rearranged, within the scope of the present invention.

Figure 12:
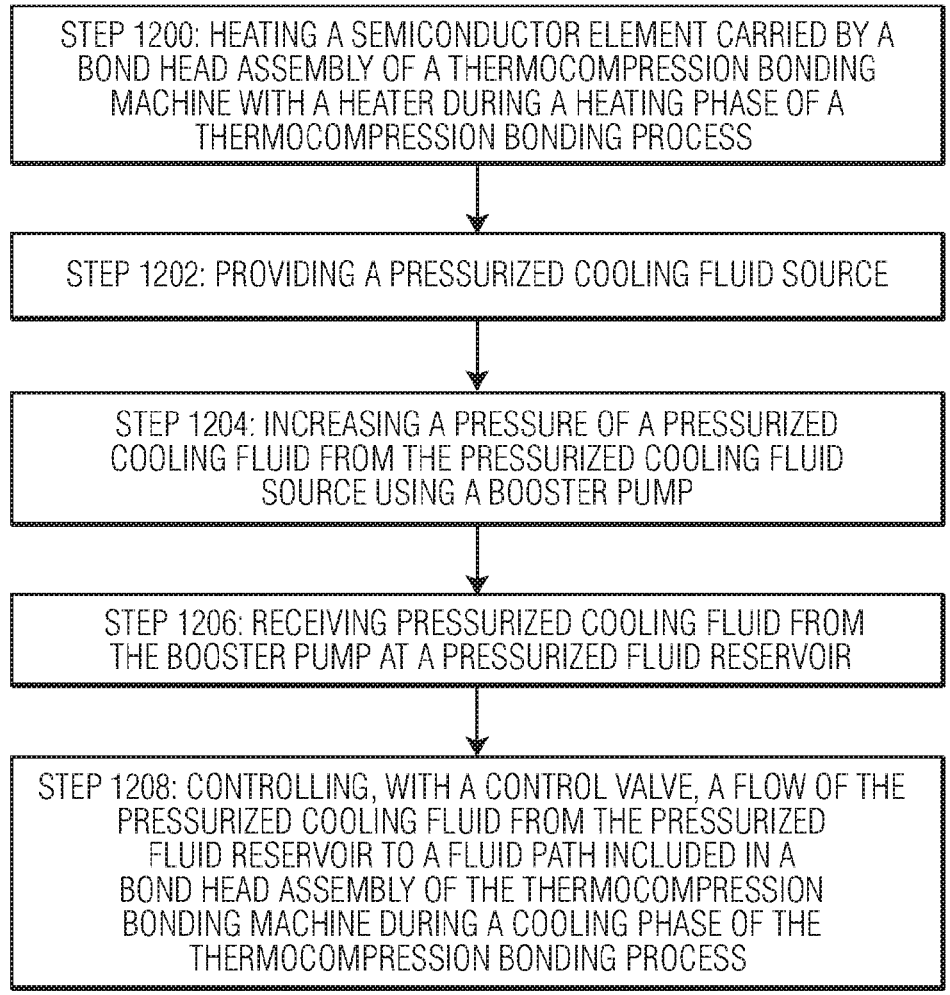
FIGS. 12-17 are flow diagrams illustrating methods of operating thermocompression bonding systems in accordance with various exemplary embodiments of the present invention.

Referring specifically to FIG. 12, at Step 1200 a semiconductor element carried by a bond head assembly of a thermocompression bonding machine is heated with a heater during a heating phase/process of a thermocompression bonding process. At Step 1202, a pressurized cooling fluid source (e.g., factory compressed air) is provided. At Step 1204, a pressure of a pressurized cooling fluid from the pressurized cooling fluid source is increased using a booster pump. At Step 1206, pressurized cooling fluid from the booster pump is received at a pressurized fluid reservoir. At Step 1208, a flow of the pressurized cooling fluid from the pressurized fluid reservoir is controlled using a control valve (e.g., an on/off digital control valve) to a fluid path included in a bond head assembly of the thermocompression bonding machine during a cooling phase/process of the thermocompression bonding process. For example, the arrangement of system 700 illustrated in FIG. 7 may be used to perform the method of FIG. 12.

Figure 13:
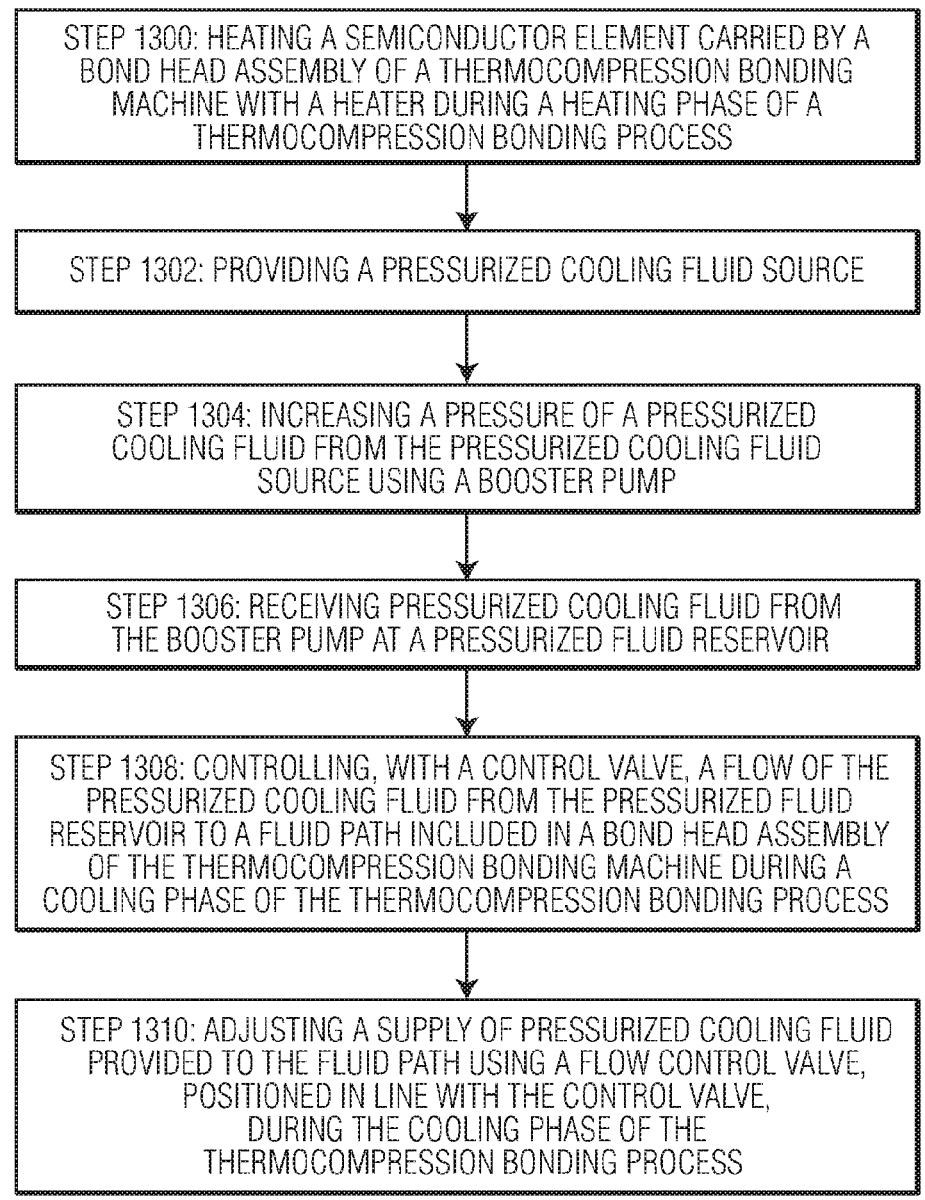

Referring specifically to FIG. 13, at Step 1300 a semiconductor element carried by a bond head assembly of a thermocompression bonding machine is heated with a heater during a heating phase/process of a thermocompression bonding process. At Step 1302, a pressurized cooling fluid source (e.g., factory compressed air) is provided. At Step 1304, a pressure of a pressurized cooling fluid from the pressurized cooling fluid source is increased using a booster pump. At Step 1306, pressurized cooling fluid from the booster pump is received at a pressurized fluid reservoir. At Step 1308, a flow of the pressurized cooling fluid from the pressurized fluid reservoir is controlled using a control valve (e.g., an on/off digital control valve) to a fluid path included in a bond head assembly of the thermocompression bonding machine during a cooling phase/process of the thermocompression bonding process. At Step 1310, a supply of pressurized cooling fluid provided to the fluid path is controlled using a flow control valve, positioned in line with the control valve, during the cooling phase/process of the thermocompression bonding process. For example, the arrangement of systems 200 and 300 illustrated in FIGS. 2-3, respectively, may be used to perform the method of FIG. 13.

Figure 14:
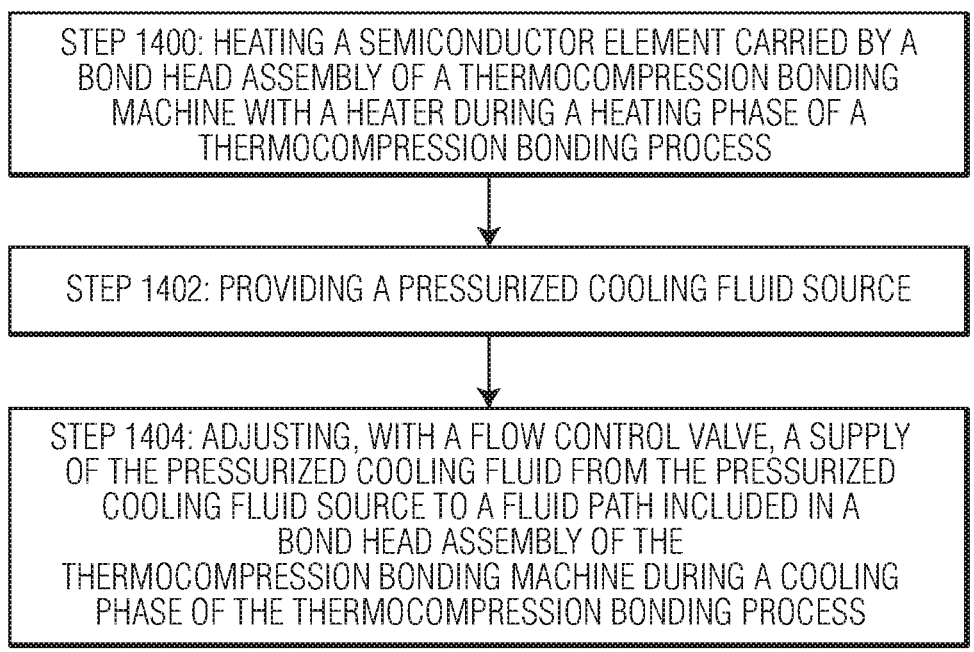

Referring specifically to FIG. 14, at Step 1400 a semiconductor element carried by a bond head assembly of a thermocompression bonding machine is heated with a heater during a heating phase/process of a thermocompression bonding process. At Step 1402, a pressurized cooling fluid source (e.g., factory compressed air) is provided. At Step 1404, a supply of the pressurized cooling fluid from the pressurized cooling fluid source to a fluid path included in a bond head assembly of the thermocompression bonding machine is controlled using a flow control valve during a cooling phase/process of the thermocompression bonding process. For example, the arrangement of system 600 illustrated in FIG. 6 may be used to perform the method of FIG. 14.

Figure 15:
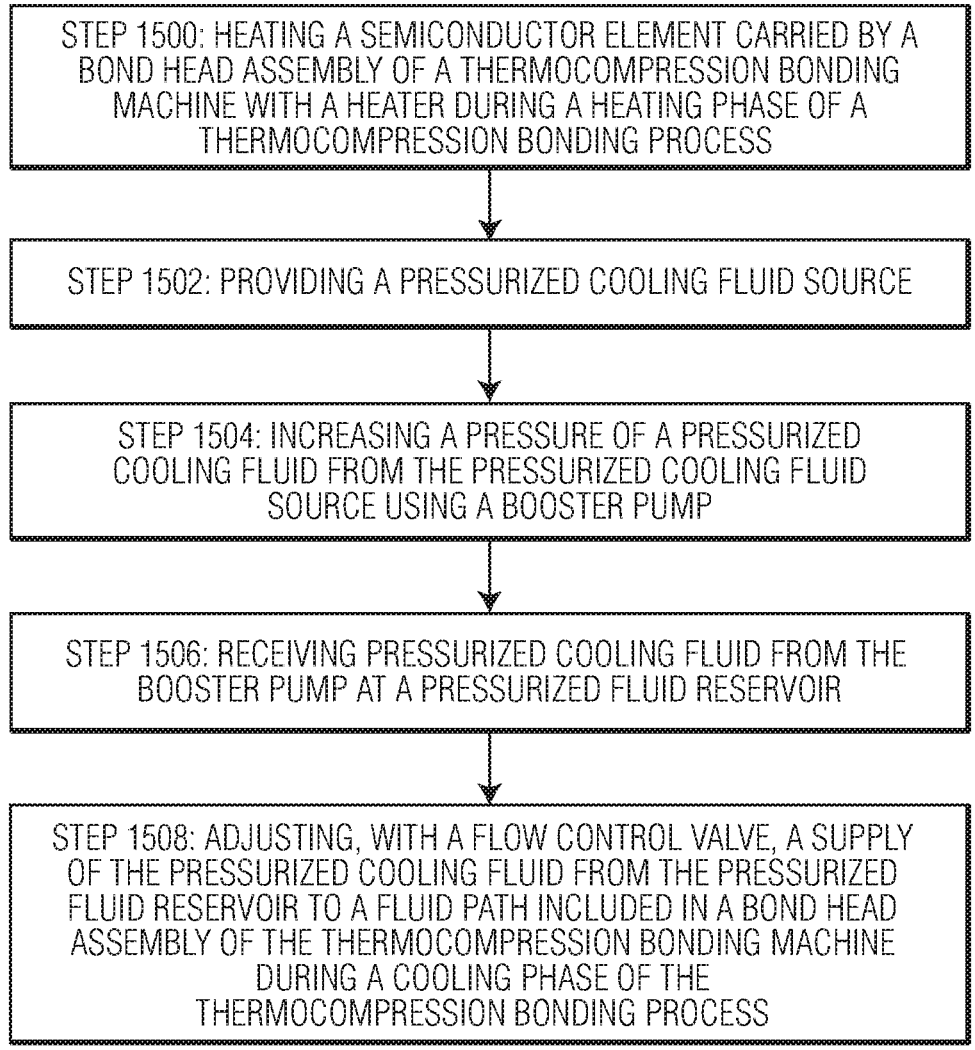

Referring specifically to FIG. 15, at Step 1500 a semiconductor element carried by a bond head assembly of a thermocompression bonding machine is heated with a heater during a heating phase/process of a thermocompression bonding process. At Step 1502, a pressurized cooling fluid source (e.g., factory compressed air) is provided. At Step 1504, a pressure of a pressurized cooling fluid from the pressurized cooling fluid source is increased using a booster pump. At Step 1506, pressurized cooling fluid from the booster pump is received at a pressurized fluid reservoir. At Step 1508, a supply of the pressurized cooling fluid from the pressurized fluid reservoir to a fluid path included in a bond head assembly of the thermocompression bonding machine is controlled using a flow control valve during a cooling phase/process of the thermocompression bonding process. For example, the arrangement of system 600 illustrated in FIG. 6 may be used to perform the method of FIG. 15.

Figure 16:
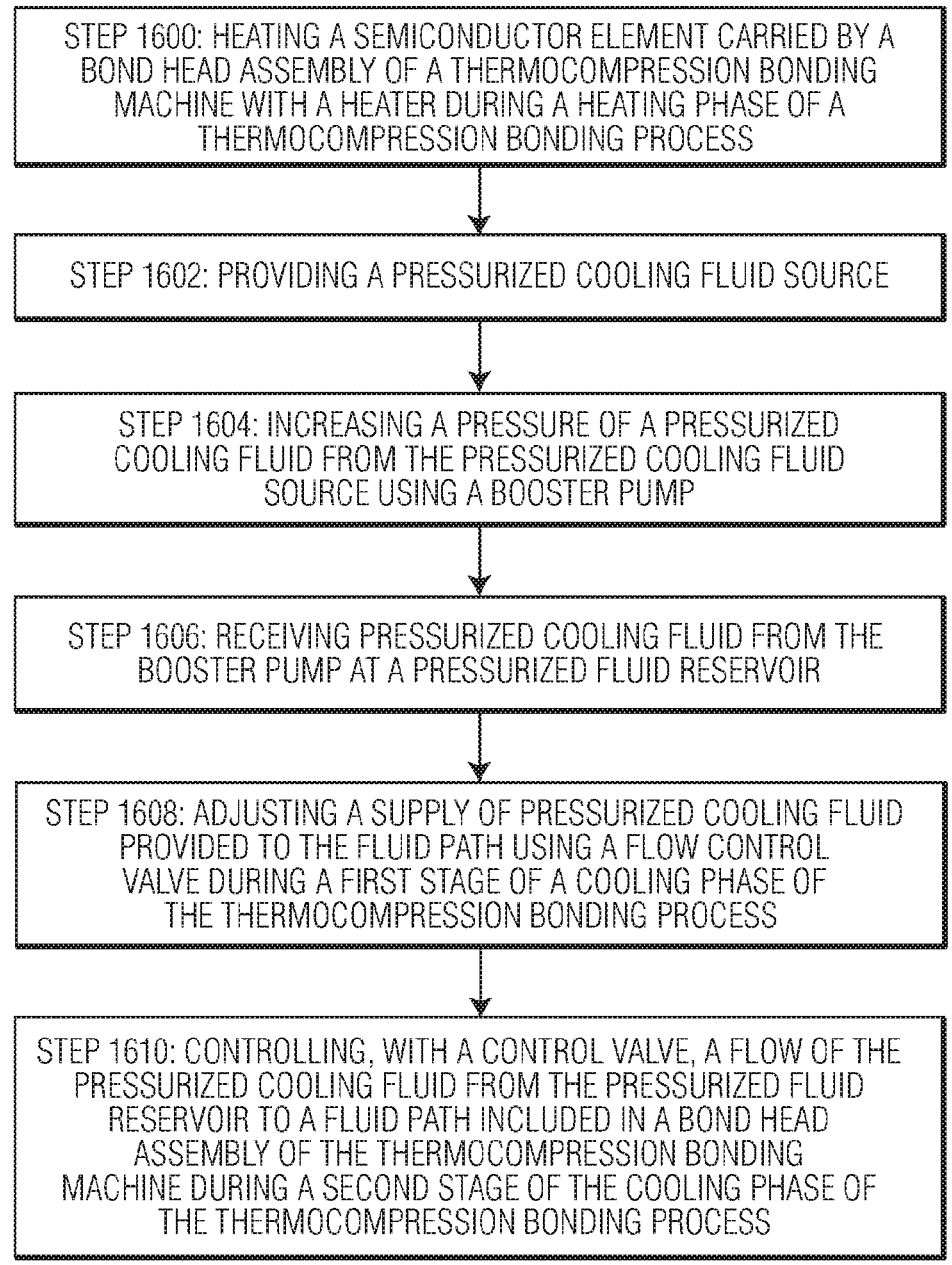

Referring specifically to FIG. 16, at Step 1600 a semiconductor element carried by a bond head assembly of a thermocompression bonding machine is heated with a heater during a heating phase/process of a thermocompression bonding process. At Step 1602, a pressurized cooling fluid source (e.g., factory compressed air) is provided. At Step 1604, a pressure of a pressurized cooling fluid from the pressurized cooling fluid source is increased using a booster pump. At Step 1606, pressurized cooling fluid from the booster pump is received at a pressurized fluid reservoir. At Step 1608, a supply of pressurized cooling fluid provided to the fluid path is adjusted using a flow control valve during a first stage of a cooling phase/process of the thermocompression bonding process. At Step 1610, a flow of the pressurized cooling fluid from the pressurized fluid reservoir to a fluid path included in a bond head assembly of the thermocompression bonding machine is controlled using a control valve during a second stage of the cooling phase/process of the thermocompression bonding process. For example, such a multi-stage cooling approach during the cooling phase/process of the thermocompression bonding process may yield results similar to those shown in FIGS. 10-11. For example, the arrangement of systems 400 and 500 illustrated in FIGS. 4-5 may be used to perform the method of FIG. 16.

Figure 17:
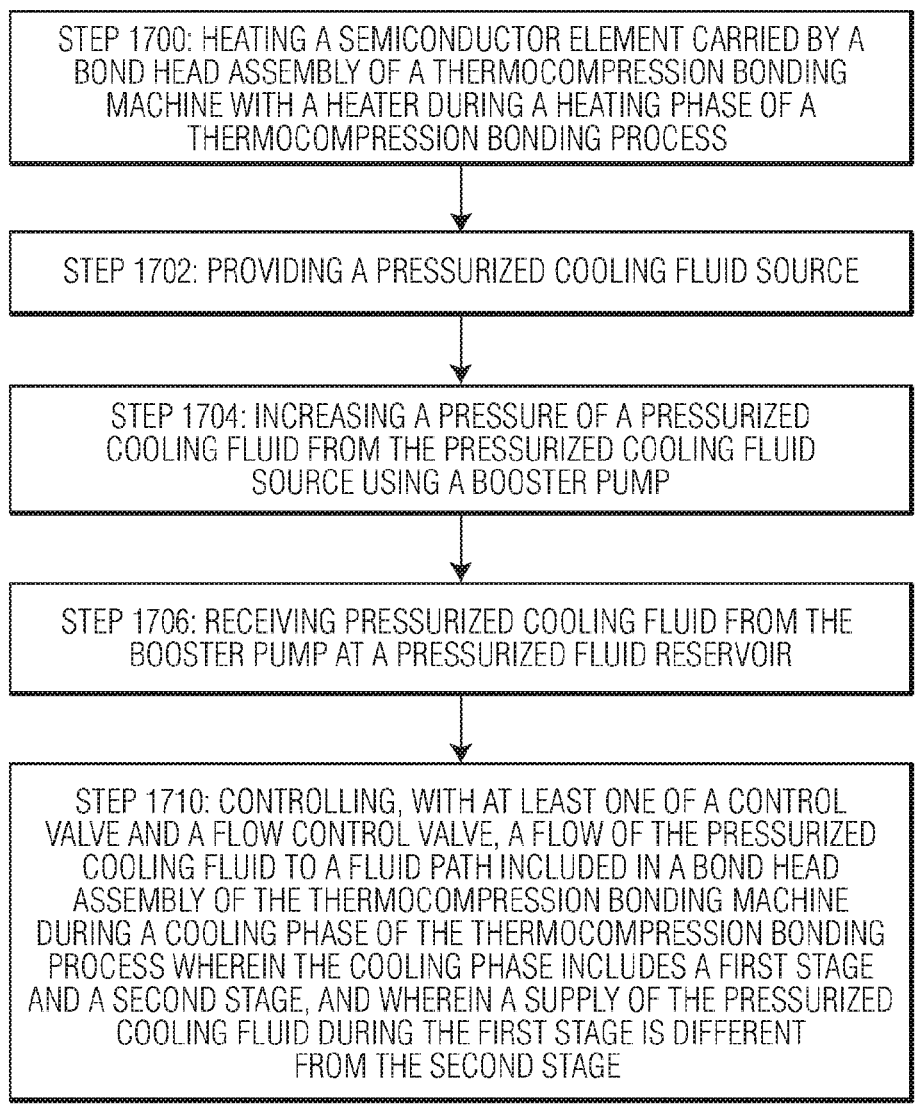

Referring specifically to FIG. 17, at Step 1700 a semiconductor element carried by a bond head assembly of a thermocompression bonding machine is heated with a heater during a heating phase/process of a thermocompression bonding process. At Step 1702, a pressurized cooling fluid source (e.g., factory compressed air) is provided. At Step 1704, a pressure of a pressurized cooling fluid from the pressurized cooling fluid source is increased using a booster pump. At Step 1706, pressurized cooling fluid from the booster pump is received at a pressurized fluid reservoir. At Step 1708, a flow of the pressurized cooling fluid to a fluid path included in a bond head assembly of the thermocompression bonding machine is controlled (with at least one of a control valve and a flow control valve) during a cooling phase/process of the thermocompression bonding process wherein the cooling phase/process includes a first stage and a second stage, and wherein a supply of the pressurized cooling fluid during the first stage is different from the second stage. For example, the arrangement of system 200, 300, 400, 500, and 600 illustrated in FIGS. 2-6, respectively, may be used to perform the method of FIG. 17.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a thermocompression bonding system, the method comprising the steps of:
    providing a pressurized cooling fluid source;
    increasing a pressure of a pressurized cooling fluid from the pressurized cooling fluid source using a booster pump;
    receiving pressurized cooling fluid from the booster pump at a pressurized fluid reservoir; and
    controlling, with a control valve, a flow of the pressurized cooling fluid from the pressurized fluid reservoir to a fluid path included in a bond head assembly of the thermocompression bonding system to be different during different stages of a cooling phase of a bonding cycle of the thermocompression bonding system.

2. The method of claim 1 further comprising the step of adjusting a supply of pressurized cooling fluid provided to the fluid path using a flow control valve.

3. The method of claim 2 wherein the flow control valve is positioned in line with the control valve.

4. The method of claim 3 wherein the flow control valve is positioned downstream of the control valve in relation to the flow of the pressurized cooling fluid provided to the fluid path.

5. The method of claim 3 wherein the flow control valve is positioned upstream of the control valve in relation to the flow of the pressurized cooling fluid provided to the fluid path.

6. The method of claim 2 wherein the flow control valve is positioned in parallel with a fluid path including the control valve.

7. The method of claim 2 further comprising the step of providing pressurized cooling fluid to the flow control valve using the booster pump.

8. The method of claim 2 wherein the flow control valve is positioned in parallel with a fluid path including the booster pump, the pressurized fluid reservoir, and the control valve.

9. The method of claim 2 further comprising the step of controlling at least one of the control valve and the flow control valve using a computer.

10. The method of claim 9 further comprising the steps of sensing a temperature of a heater of the bond head assembly using a temperature sensor, and receiving information related to the temperature of the heater sensed by the temperature sensor using the computer.

11. The method of claim 2 wherein the flow control valve is an analog control valve.

12. The method of claim 1 wherein the control valve is a digital on/off control valve.

13. The method of claim 1 wherein a pressure of the pressurized cooling fluid from the pressurized cooling fluid source is increased using the booster pump by at least 50%.

14. The method of claim 1 wherein the bond head assembly includes a bond tool for bonding a semiconductor element to a substrate, wherein a heater of the bond head assembly heats the semiconductor element by heating the bond tool, and wherein the heater is cooled by the pressurized cooling fluid provided to the fluid path.

15. The method of claim 1 wherein the bond head assembly includes a heater configured as a bond tool for bonding a semiconductor element to a substrate, the heater being cooled by the pressurized cooling fluid being provided to the fluid path.

* * * * *